United States Patent
Powell

[11] Patent Number: 6,157,048
[45] Date of Patent: Dec. 5, 2000

[54] THIN FILM TRANSISTORS WITH ELONGATED COILED ELECTRODES, AND LARGE AREA DEVICES CONTAINING SUCH TRANSISTORS

[75] Inventor: Martin J. Powell, Horley, United Kingdom

[73] Assignee: U.S. Philips Corporation, New York, N.Y.

[21] Appl. No.: 09/348,959

[22] Filed: Jul. 7, 1999

[30] Foreign Application Priority Data

Aug. 5, 1998 [GB] United Kingdom .................... 9816942
Apr. 2, 1999 [GB] United Kingdom .................... 9902347

[51] Int. Cl.[7] .......................... H01L 29/04; H01L 31/20; H01L 31/036; H01L 31/0376
[52] U.S. Cl. .............................. 257/59; 257/57; 257/347; 257/350; 257/401
[58] Field of Search ................. 257/57, 59, 347, 257/350, 401

[56] References Cited

U.S. PATENT DOCUMENTS 3,803,461 4/1974 Beneking .
4,783,147 11/1988 Maurice et al. .
5,144,388 9/1992 Sawada et al. .
5,874,746 2/1999 Holmberg et al. ........................ 257/59

*Primary Examiner*—Ngân V. Ngô
*Attorney, Agent, or Firm*—John C. Fox

[57] ABSTRACT

A thin film transistor has source (20) and drain (10) electrodes which each comprise a coiled elongate portion. One (14) of these portions coils inwardly to a central connector portion (12), and the other (22) coils outwardly to a peripheral connector portion (16). The two coiled portions are interlinked to define between them a substantially uniform spacing (24) corresponding to a channel region of the transistor. This arrangement enables the length to width ratio of the transistor to be reduced, giving rise to an increased current capacity of the transistor. By making one elongate portion (14) longer than the other (22), the transistor can have a source-gate capacitance lower than its drain-gate capacitance. These transistors may form switching elements in large area electronic devices, such as electroluminescent displays, plasma displays, electrostatic print heads, and X-ray dynamic beam attenuators.

20 Claims, 2 Drawing Sheets

THIN FILM TRANSISTORS WITH ELONGATED COILED ELECTRODES, AND LARGE AREA DEVICES CONTAINING SUCH TRANSISTORS

BACKGROUND OF THE INVENTION

This invention relates to thin film transistors (hereinafter termed "TFTs") and to large area electronic devices (for example electroluminescent displays, plasma displays, electrostatic print heads, and X-ray dynamic beam attenuators) comprising such TFTs.

For many years there has been much interest in developing thin film circuits with TFTs on glass and/or on other inexpensive insulating substrates, for large area electronics applications. Such TFTs fabricated with amorphous or polycrystalline semiconductor films are commonly used to form the switching devices in active matrix liquid crystal displays.

One problem encountered with TFTs is that their use is limited to relatively low power applications, primarily as a result of the low mobility in the deposited semiconductor layer, in comparison to single-crystal ion implanted transistor structures. There is therefore a need to produce a TFT which can be used in higher power applications, for example as switching devices in electroluminescent display panels, plasma display panels or electrostatic printheads.

JP 61-131481A discloses a thin film transistor in which an annular source electrode is disposed concentrically around a central drain pad, to define a channel between the source and drain. This structure reduces the overall size of the transistor to achieve given response characteristics.

BRIEF DESCRIPTION OF THE INVENTION

According to the invention, there is provided a thin film transistor in which each of the source and drain electrodes comprises a coiled elongate portion, one of the elongate portions coiling inwardly to a central connector portion and the other coiling outwardly to a peripheral connector portion, the elongate portions being interlinked to define between them a substantially uniform spacing corresponding to a channel region of the transistor.

This coiled arrangement enables a very small channel length to be achieved, in combination with a very high channel width, which gives rise to increased current capacity of the transistor, and thereby enables use of the transistor in higher power applications. Furthermore, by making one elongate portion longer than the other, the transistor can have a source-gate capacitance line capacitance (source-line capacitance), for a given size of switching transistor. As such, it leads to lower signal distortion and shorter allowable addressing times for arrays.

The channel region is preferably formed from amorphous silicon. Standard amorphous silicon thin film transistors have particular difficulties meeting current and voltage requirements for certain applications, and this invention may enable such transistors to be used in applications where the use of amorphous silicon transistors would not previously have been appropriate.

The thin film transistor may have a staggered structure, although the invention may be applied to any existing type of TFT, as the general process technology used in the manufacture of existing different types of TFT is not affected by the pattern of the source and drain electrodes as provided by this invention.

The arrangement of central connector pad for one of the source and drain, and a peripheral connector for the other enables the connections to the source and drain of the transistor to be a significant distance apart which assists in reducing cross-talk between those connections.

The invention will now be described by way of example, with reference to the accompanying drawings.

Figure 1:
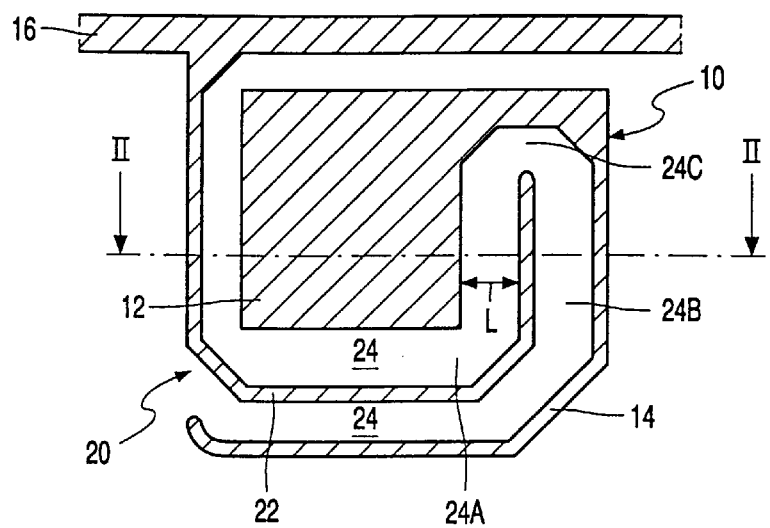
FIG. 1 shows in plan view one configuration of source, drain and channel in a TFT according to the invention.

It should be understood that the Figures are merely schematic and are not drawn to scale. In particular, certain dimensions such as the thickness of layers or regions may have been exaggerated whilst other dimensions may have been reduced. It should also be understood that the same reference numerals are used throughout the figures to indicate the same or similar parts.

DETAILED DESCRIPTION OF THE INVENTION

FIG. 1 shows a thin film transistor of the invention, in plan view. The drain electrode 10 comprises a central pad 12 from which extends an elongate coiled portion 14. The elongate portion 14 of the drain electrode 10 effectively spirals outwardly from the pad 12. The source electrode 20 branches from a line conductor 16 and comprises an elongate coiled portion 22 which effectively spirals inwardly towards the drain pad 12. The elongate portions 14 and 22 of the source and drain electrodes 10 and 20 are interleaved so that a substantially uniform spacing 24 is defined between them, which corresponds to a channel region of the transistor. The channel region thereby comprises a passage which has a first coiled branch 24A between the drain pad 12 and the elongate portion 22 of the source, and a second coiled branch 24B parallel to the first branch and radially outside the first branch 24A. The channel thereby comprises a first spiral portion 24A and a second spiral portion 24B coupled together at a 180 degree bend 24C.

In this way, the channel of the transistor has a very short length (the distance between the source and drain) but a very large width. In known manner, an increase in the width to length ratio of a field effect transistor gives the possibility of higher operating currents, which enables the transistor to be suitable for increased power applications.

The structure of the drain and source 10 and 20, which together define the channel region, of the transistor shown in FIG. 1 may be applied to any type of thin film transistor, as the specific process technology for known thin film transistor designs is not effected by the pattern of the source and drain electrodes. For example, the principle of the invention may be applied to top gate or bottom gate staggered transistors, or to co-planar types of TFT. Similarly, the layout may be applied to amorphous silicon TFTs or to polycrystalline silicon TFTs (or even to other types of semiconductor material). The source and drain electrodes 20 and 10 (and their elongate portions 22 and 14) may comprise deposited metal tracks and/or highly doped regions of a semiconductor film, with an intrinsic or very slightly doped region in the spacing 24 defining the channel.

Figure 2:
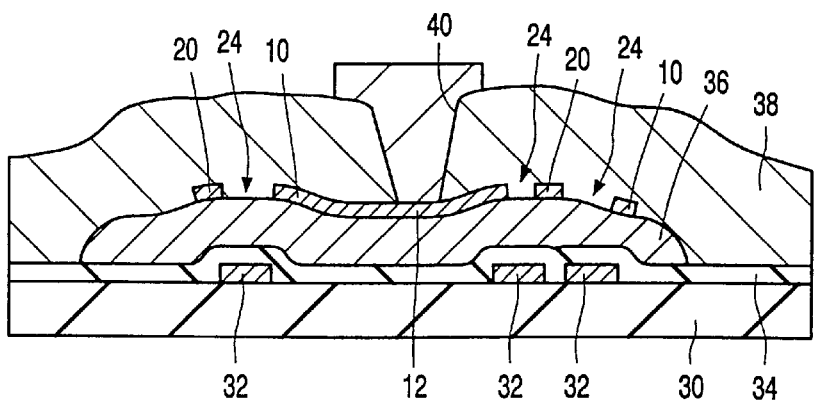
FIG. 2 is a cross section taken along line II—II in FIG. 1.

One possible structure for the TFT is represented in FIG. 2, as a cross section along line II—II of FIG. 1.

The structure shown in FIG. 2 comprises an insulating substrate 30, for example glass, over which a gate electrode pattern 32 is deposited, corresponding to the channel region 24 of the transistor.

A gate dielectric layer 34 is provided as a layer covering the gate electrodes, and a semiconductor island having the shape of the transistor to be formed is provided over the gate dielectric layer 34. In the preferred use of the invention, the semiconductor island 36 comprises intrinsic amorphous silicon. The drain 10 and source 20 are patterned over the semiconductor layer 36 in the configuration shown in FIG. 1. The spacing between the drain pattern and the source pattern overlies the gate electrodes 32, so that a channel region of the thin film transistor is defined as the spacing 24 between adjacent source and drain electrode portions.

As shown in FIG. 1, the source is connected to a source line 16 (not shown in the cross section of FIG. 2) which may have lead out terminals at the edge of an array including the thin film transistors of the invention. In order to make contact with the drain pad 12, an insulating layer 38 has been shown in FIG. 2 having a through hole 40 enabling contact with the drain pad 12.

Although the gate electrodes 32 have been shown as following the contour of the channel 24, the gate electrode may conceivably comprise a continuous contact pad over the area of the transistor. If a patterned gate electrode is to be used, the edges of the gate electrodes may be aligned with the edges of the source and drain electrodes, as shown in FIG. 2, or alternatively there may be provided an overlap or an offset between the source/drain and the gate electrodes.

In the case of a polycrystalline structure, the source and drain 20 and 10 may comprise ion implanted regions in the polycrystalline silicon layer that provides the channel region 24. Of course, in this case a low doped drain (LDD) structure may be employed. Various arrangements are well known for reducing the series resistance between the source and drain electrodes and the channel region of the transistor.

Standard processing techniques and technologies for thin film transistor manufacture, which will be known to those skilled in the art, can be employed in the manufacture of transistors of the invention. The pattern of the source and drain electrodes does not alter the applicability of these standard techniques. A detailed description of the possible materials and processing steps which may be employed is therefore not provided in this application.

Figure 3:
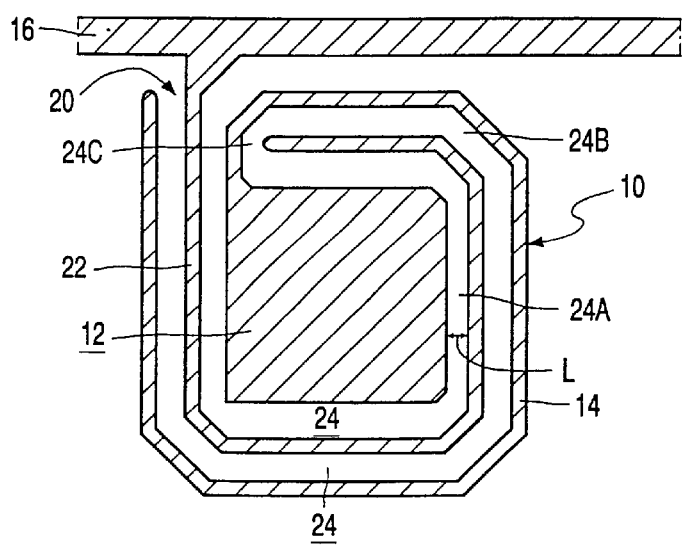
FIG. 3 shows in plan view an alternative arrangement of source, drain and channel for a TFT according to the invention.

FIG. 3 illustrates a second embodiment of a thin film transistor in accordance with the invention, in which the length L of the channel is reduced further, and the width is increased by introducing a greater degree of turning of the coiled source and drain electrodes. In other words, increased spiralling of the source 20 and drain 10 is provided. Again, a first branch 24A of the channel defined between the source and drain spirals inwardly to a position adjacent the drain pad 12, and a second branch 24B spirals parallel to the first branch and radially outside the first branch 24A. The channel thereby comprises a first spiral portion and a second spiral portion coupled together at a 180 degree bend 24C.

For further increases in the width to length ratio of the transistor, an increasing number of turns in the spirals may be utilised.

The transistor of FIG. 3 has a source-gate capacitance lower than its drain-gate capacitance. This results from the elongate portion 14 of the drain electrode 10 being longer than the elongate portion 22 of the source electrode 20. The elongate portion 14 coils inwardly to the drain pad 12 from the vicinity of the peripheral connector portion 16 of the other elongate portion 22. This elongate portion 22 extends between the elongate portion 14 and the drain pad 12.

Figure 4:
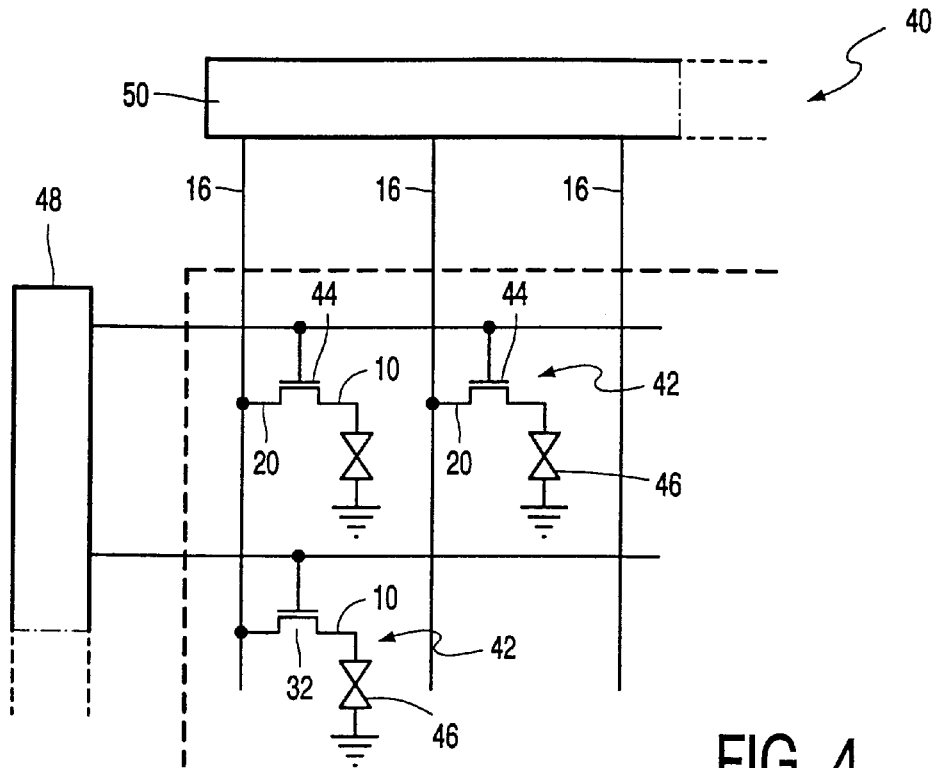
FIG. 4 shows schematically a display panel having actively addressed display cells using TFTs of the invention.

The invention may be applied to any existing thin film transistor configurations where higher than normal voltages and/or currents may be required. Such applications may include electroluminescent displays, plasma displays, electrostatic print heads and dynamic beam attenuators. As one example, FIG. 4 shows an active matrix display device 40 comprising a matrix of display cells (pixels) 42 arranged in rows and columns on a common insulating substrate. Each display cell 42 includes a thin film transistor 44 of the invention as the switching device for addressing the display element 46 of the cell. The rows and columns are coupled to row and column addressing circuitry 48,50 in known manner.

Figure 5:
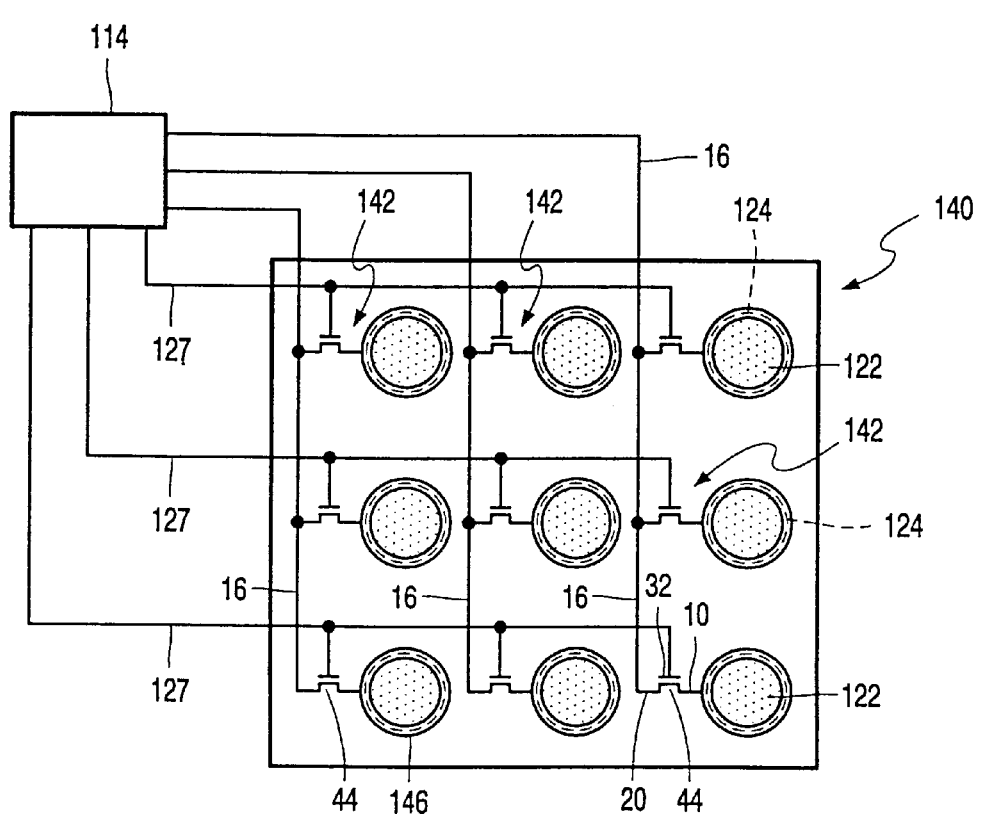
FIG. 5 shows schematically an X-ray beam attenuator having actively addressed attenuator cells using TFTs of the invention.

FIG. 5 shows an example of a dynamic beam attenuator having thin film transistors 44. Except for using thin film transistors 44 in accordance with the invention, this attenuator may be constructed and used in a manner similar to that described in published PCT International Patent Application WO 96/13040, the whole contents of which are hereby incorporated herein as reference material. The present FIG. 5 is based on FIG. 5 of WO 96/13040. As illustrated in FIG. 5, the attenuator device 140 comprises a matrix of attenuator cells (pixels) 142 arranged in rows and columns on a common insulating substrate. Each attenuator cell 42 includes a TFT 44 of the invention as the switching device for addressing the attenuator element 146 of the cell. The gate electrodes 32 of the TFTs 44 are connected to row conductors 127, and the source electrodes 20 are connected to column conductors 16. As in WO 96/13040, the cells 42 can be addressed by adjusting circuitry 114 connected to the conductors 16 and 127. The attenuating elements may be of the type described in WO 96/13040, comprising a capillary tube 124 for an X-ray absorbing liquid 122. The TFT drain 10 is connected to the tube 124.

The source and drain electrodes 20 and 10 have been described as having a spiral configuration. This does not require the electrodes to have a continuous curve with a continually increasing or decreasing radius of curvature. Indeed, in the examples shown in FIGS. 1 and 3, the electrode patterns are arranged as a series of connected linear portions. It is preferred, however, to avoid sharp corners in the electrode patterns, which can lead to field enhancement and consequently premature breakdown under high voltage operation.

The electrode design of the invention also provides a central connector for the drain (the drain pad 12) and a peripheral line conductor for the source. These two connections are thereby kept a distance apart which assists in avoiding high cross talk between the source and drain of the thin film transistor.

What is claimed is:

1. A thin film transistor in which each of the source and drain electrodes comprises a coiled elongate portion, one of the elongate portions coiling inwardly to a central connector portion and the other coiling outwardly to a peripheral connector portion, the elongate portions being interlinked to define between them a substantially uniform spacing corresponding to a channel region of the transistor.

2. A thin film transistor as claimed in claim 1, wherein the said one elongate portion is longer than said other elongate portion.

3. A thin film transistor as claimed in claim 2, wherein the drain electrode comprises said one elongate portion, and the source electrode comprises said other elongate portion, the transistor having a source-gate capacitance lower than its drain-gate capacitance.

4. A thin film transistor as claimed in claim 2, wherein the said one elongate portion coils inwardly to the central connector portion from the vicinity of the peripheral connector portion of said other elongate portion.

5. A thin film transistor as claimed in claim 1, wherein a semiconductor film comprising the channel region extends on a dielectric layer over a gate electrode on an insulating substrate, and the source and drain electrodes are present in or on the semiconductor film.

6. A thin film transistor as claimed in claim 1, wherein the channel region is formed from amorphous silicon.

7. A large area electronic device comprising a plurality of thin film transistors as claimed in claim 1 which are provided on a common insulating substrate, wherein the peripheral connector connects together electrodes of a group of the transistors.

8. A large area electronic device as claimed in claim 7, comprising a display panel having an array of display cells, each cell including a thin film transistor.

9. A large area electronic device as claimed in claim 7, comprising dynamic beam attenuator having an array of attenuator cells, each cell including a thin film transistor.

10. A thin film transistor as claimed in claim 2, wherein said one elongate portion coils inwardly to the central connector portion from the vicinity of the peripheral connector portion of the said other elongate portion.

11. A thin film transistor as claimed in claim 10, wherein said channel region is formed from amorphous silicon.

12. A thin film transistor as claimed in claim 2, wherein a semiconductor film comprising the channel region extends on a dielectric layer over a gate electrode on an insulating substrate, and the source and drain electrodes are present in or on the semiconductor film.

13. A thin film transistor as claimed in claim 12, wherein said channel region is formed from amorphous silicon.

14. A thin film transistor as claimed in claim 3, wherein a semiconductor film comprising the channel region extends on a dielectric layer over a gate electrode on an insulating substrate, and the source and drain electrodes are present in or on the semiconductor film.

15. A thin film transistor as claimed in claim 14, wherein said channel region is formed from amorphous silicon.

16. A thin film transistor as claimed in claim 4, wherein a semiconductor film comprising the channel region extends on a dielectric layer over a gate electrode on an insulating substrate, and the source and drain electrodes are present in or on the semiconductor film.

17. A thin film transistor as claimed in claim 16, wherein said channel region is formed from amorphous silicon.

18. A large area electronic device comprising a plurality of thin film transistors as claimed in claim 3 which are provided on a common insulating substrate, wherein the peripheral connector portion connects together electrodes of a group of the transistors.

19. A large area electronic device comprising a plurality of thin film transistors as claimed in claim 4 which are provided on a common insulating substrate, wherein the peripheral connector portion connects together electrodes of a group of the transistors.

20. A large area electronic device comprising a plurality of thin film transistors as claimed in claim 5 which are provided on a common insulating substrate, wherein the peripheral connector portion connects together electrodes of a group of the transistors.

* * * * *